United States Patent
Kilcoyne et al.

(10) Patent No.: US 10,672,826 B2
(45) Date of Patent: Jun. 2, 2020

(54) SEGMENTED CHANNEL STOP GRID FOR CROSSTALK MITIGATION IN VISIBLE IMAGING ARRAYS

(71) Applicant: RAYTHEON COMPANY, Waltham, MA (US)

(72) Inventors: Sean P. Kilcoyne, Lompoc, CA (US); John L. Vampola, Santa Barbara, CA (US); George Paloczi, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 96 days.

(21) Appl. No.: 15/955,820

(22) Filed: Apr. 18, 2018

(65) Prior Publication Data
US 2019/0326346 A1 Oct. 24, 2019

(51) Int. Cl.
*H01L 27/146* (2006.01)
*H04N 5/335* (2011.01)
*H04N 5/235* (2006.01)

(52) U.S. Cl.
CPC .... *H01L 27/14643* (2013.01); *H01L 27/1463* (2013.01); *H01L 27/14618* (2013.01); *H04N 5/2353* (2013.01); *H04N 5/335* (2013.01)

(58) Field of Classification Search
CPC ......... H01L 27/14643; H01L 27/14618; H01L 27/1463; H04N 5/2353; H04N 5/335
See application file for complete search history.

(56) References Cited

U.S. PATENT DOCUMENTS

| 2005/0133825 A1* | 6/2005 | Rhodes | H01L 27/1463 257/204 |
| 2015/0035014 A1 | 2/2015 | Drab et al. | |
| 2016/0204144 A1 | 7/2016 | Lee | |
| 2016/0276394 A1* | 9/2016 | Chou | H01L 27/14645 |

FOREIGN PATENT DOCUMENTS

| CN | 107910340 A | 4/2018 |
| EP | 2150991 A2 | 2/2010 |

OTHER PUBLICATIONS

International Search Report and Written Opinion in application No. PCT/US2019/016473 dated May 15, 2019.
Bai et al. "Inter-Pixel Capacitance in Fully-Depleted Silicon Hybrid CMOS Focal Plane Arrays", Proceedings of SPIE vol. 6690, 669004 (2007), pp. 1-8.
Moore et al. "Interpixel capacitance in non-destructive focal plane arrays", Proceedings of SPIE vol. 5167 (2004), pp. 204-215.
Bai et al. "Teledyne Imaging Sensors: Silicon CMOS imaging technologies for x-ray, UV, visible and near infrared", Proceedings of SPIE (2008), pp. 1-16.
(Continued)

*Primary Examiner* — Georgia Y Epps
*Assistant Examiner* — Don J Williams
(74) *Attorney, Agent, or Firm* — Lando & Anastasi, LLP

(57) ABSTRACT

An imaging system includes a focal plane array comprising a first row of photodetectors, a second row of photodetectors adjacent to the first row of photodetectors, and a segmented isolation grid including portions disposed between photodetectors in the first row of photodetectors and photodetectors in the second row of photodetectors.

13 Claims, 6 Drawing Sheets

(56) References Cited

OTHER PUBLICATIONS

Holland et al. "Fully-Depleted, Back-Illuminated Charge-Coupled Devices Fabricated on High-Resistivity Silicon", IEEE Transactions on Electron Devices (2003) vol. 50, No. 1, pp. 101-114.
Moore "Operating, Testing and Evaluating Hybridized Silicon P-I-N Arrays", Rochester Institute of Technology (2005), pp. iii-278.
Shea "A Silicon p-i-n Detector for a Hybrid CMOS Imaging System", Rochester Institute of Technology (2012), pp. i-130.
Moore et al. "Quantum efficiency overestimation and deterministic cross talk resulting from interpixel capacitance", Optical Engineering (2006) vol. 45, No. 7, pp. 1-9.
Moore et al. "Operation and Test of Hybridized Silicon p-i-n Arrays Using Open-source Array Control Hardware and Software", Proceedings of SPIE-IS&T Electronic Imaging (2003), vol. 5017, pp. 240-253.

* cited by examiner

SEGMENTED CHANNEL STOP GRID FOR CROSSTALK MITIGATION IN VISIBLE IMAGING ARRAYS

BACKGROUND

Focal Plane Arrays (FPAs) generally include a two-dimensional array of detector elements, or unit cells (i.e., pixels), organized in rows and columns. A circuit within each unit cell of the FPA accumulates charge corresponding to the flux of incident optical radiation at a detector within the unit cell to generate an image of a scene or object within a field of view (FOV) of the FPA. For instance, most unit cell circuits detect optical radiation at a photo-diode. The charge is accumulated at one or more capacitive elements, which integrate the charge, and produce an integration voltage. The produced integration voltage corresponds to the intensity of the flux over a given time period referred to as the integration time (or integration interval). The resulting voltage is conveyed by additional circuitry to an output of the array, which then may be used to construct the image of the scene.

SUMMARY OF THE INVENTION

In accordance with one aspect, there is provided an imaging system including a focal plane array. The focal plane array comprises a first row of photodetectors, a second row of photodetectors adjacent to the first row of photodetectors, and a segmented isolation grid disposed between photodetectors in the first row of photodetectors and photodetectors in the second row of photodetectors.

In some embodiments, the photodetectors in each of the first row of photodetectors and the second row of photodetectors comprise P-I-N diodes or N-I-P diodes. The photodetectors in each of the first row of photodetectors and the second row of photodetectors may comprise silicon P-I-N diodes.

In some embodiments, the segmented isolation grid includes doped wall segments formed surrounding P-type regions of the photodetectors in each of the first row of photodetectors and the second row of photodetectors. In embodiments in which photodetectors comprise N-I-P diodes, the segmented isolation grid may include doped wall segments formed surrounding N-type regions of the photodetectors in each of the first row of photodetectors and the second row of photodetectors.

The imaging system may further comprise regions of intrinsic semiconductor disposed between the P-type regions and N-type regions of the photodetectors in each of the first row of photodetectors and the second row of photodetectors and the segmented isolation grid.

In some embodiments, the segmented isolation grid includes a contiguous wall extending across one of the first row of photodetectors and the second row of photodetectors.

In some embodiments, the segmented isolation grid includes discontinuous grid elements surrounding the photodetectors in each of the first row of photodetectors and the second row of photodetectors.

The segmented isolation grid may have a doping concentration less than that of the P-type regions of the photodetectors and less than that of the N-type regions of the photodetectors. The segmented isolation grid may be electrically floating.

In some embodiments, the segmented isolation grid reduces a level of crosstalk between photodetectors in the first row of photodetectors and photodetectors in the second row of photodetectors as compared to a substantially similar imaging system including a non-segmented isolation grid.

In accordance with another aspect, there is provided a method of operating a focal plane array. The method comprises applying a reverse bias to photodetectors in a first row of photodetectors of the focal plane array, integrating photocurrent produced in the photodetectors in the first row of photodetectors, and applying a reverse bias to photodetectors in a second row of photodetectors of the focal plane array while continuing to integrate the photocurrent produced in the photodetectors in the first row of photodetectors. Application of the reverse bias to the photodetectors in the second row of photodetectors inducing a voltage potential in portions of a segmented isolation grid associated with the second row of photodetectors. The voltage potential is prevented from propagating to portions of the segmented isolation grid associated with the first row of photodetectors by breaks in the segmented isolation grid between the portions of the segmented isolation grid associated with the first row of photodetectors and the portions of the segmented isolation grid associated with the second row of photodetectors.

The method may comprise operating the focal plane array in a rolling shutter mode.

In accordance with one aspect, there is provided an imaging system including a focal plane array. The focal plane array comprises an array of photodetectors including P-I-N photodiodes arranged in a plurality of rows and a plurality of columns, and an electrically floating segmented isolation grid comprising a wall of doped semiconductor having a doping level less than that of P-type regions of the P-I-N photodiodes and N-type regions of the P-I-N photodiodes. The segmented isolation grid includes individual grid elements surrounding each individual P-I-N photodiode in the array of photodetectors. A region of intrinsic semiconductor is disposed between each individual P-I-N photodiode and a corresponding segmented isolation grid element. Each individual grid element includes a plurality of electrically isolated regions that prevent flow of current between grid elements surrounding P-I-N photodiodes in adjacent rows.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Aspects and embodiments relate to Focal Plane Arrays (FPAs) including features for reducing crosstalk between adjacent imaging pixels. Various aspects and embodiments are directed to FPA unit cell circuits and methods of imaging using the same, and in particular, to imaging pixels with low crosstalk.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Typical FPA unit cell circuits accumulate charge corresponding to the flux of impinging optical radiation of a given wavelength onto a corresponding photodetector. Typically, the charge is accumulated at one or more capacitive elements per photodetector, which integrate the charge, and produce an integration voltage. If there is crosstalk between adjacent photodetectors (including, for example, first nearest neighbors, second nearest neighbors, third nearest neighbors, etc.) the charge accumulated at a capacitive element associated with an individual photodetector may not be accurately representative of the actual flux of impinging radiation received at the individual photodetector. For example, in some instances crosstalk between adjacent photodetectors may result in a greater charge being accumulated at the capacitive element associated with an individual photodetector than that which corresponds to the actual flux of impinging radiation received at the individual photodetector. Crosstalk between adjacent photodetector in an FPA thus leads to reduced image quality and dynamic range.

Figure 1A:
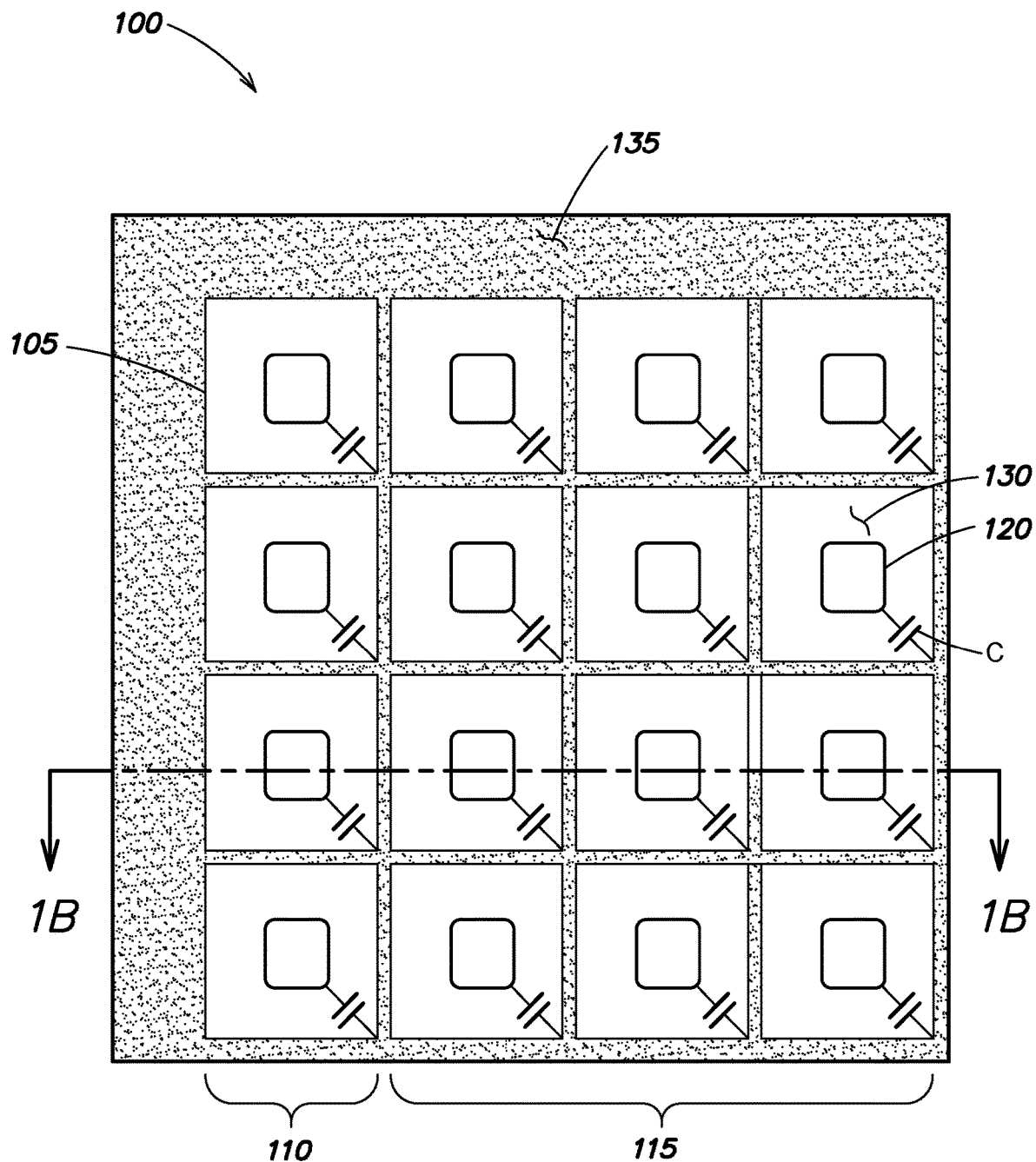
FIG. 1A is a plan view of a portion of an array of optical detectors in an embodiment of a FPA.
Figure 1B:
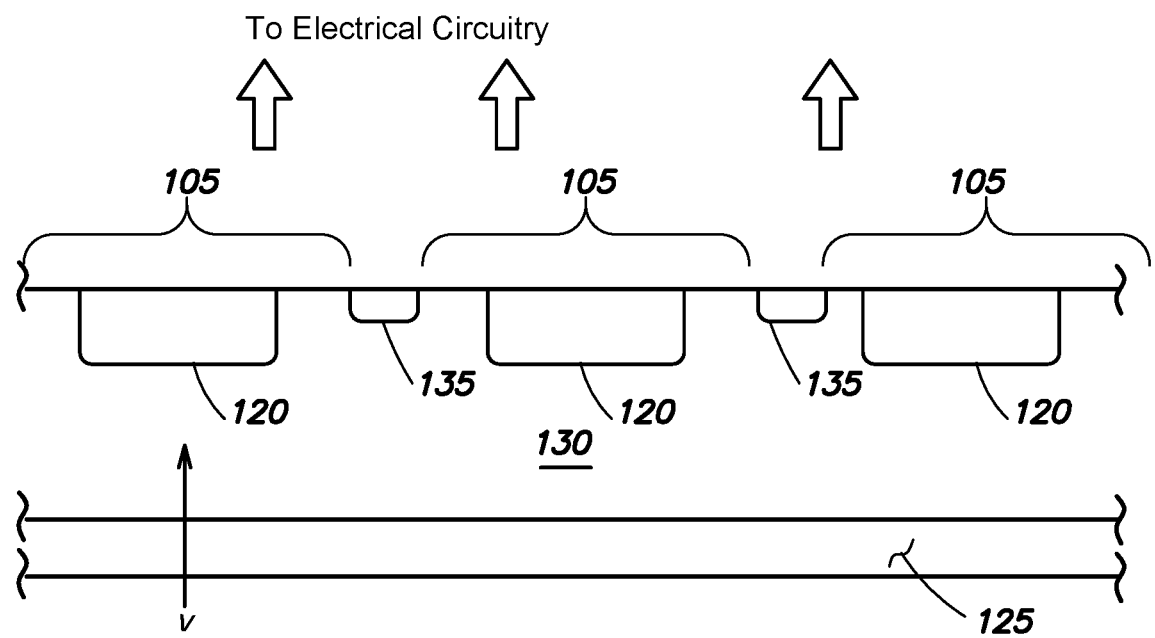
FIG. 1B is a cross section of a portion of the array of optical detectors of FIG. 1A through line 1B-1B of FIG. 1A.
Figure 1C:
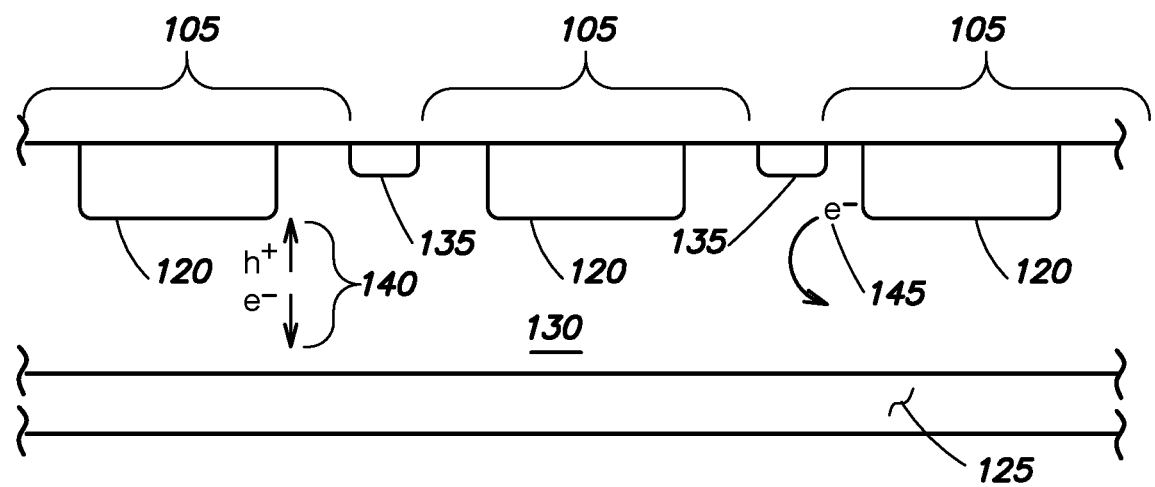
FIG. 1C is another cross section of a portion of the array of optical detectors of FIG. 1A, illustrating the migration of photo-generated free carriers in the optical detectors.

FIG. 1A shows a partial plan view of one embodiment of a FPA 100 including a rectangular array of photodetectors 105. FIGS. 1B and 1C illustrate partial cross sectional views through line 1B-1B of FIG. 1A. In the embodiment illustrated in FIGS. 1A-1C the photodetectors 105 include photodiodes, for example, silicon P-I-N photodiodes. The FPA 100 includes an outer periphery of guard photodetectors 110 that are not used for imaging and that surround an image core 115 including photodetectors 105 that are used for imaging. Each photodetector 105 includes a P-doped region 120 and an N-doped region 125 formed in a region of intrinsic silicon 130. The P-doped regions 120 and N-doped regions 125 of each photodetector 105 are separated by a portion of the region of intrinsic silicon 130. The P-doped regions 120 and N-doped regions 125 are coupled to an external circuit (not illustrated) that accumulates photo-generated charge produced in the photodetectors 105 and produces a representation of an image from the charge produced in the photodetectors 105. Although described herein as being formed of silicon, the photodetectors 105 may in other embodiments include P-doped regions, N-doped regions, and intrinsic regions of different semiconductors, for example, germanium, indium gallium arsenide, mercury cadmium telluride, etc. In other embodiments, the locations of the P-doped regions and the N-doped regions may be reversed.

In use, the P-I-N photodiodes 105 are reverse biased. A photon v that reaches the intrinsic silicon region 130 between the P-doped region 120 and N-doped region 125 (FIG. 1B) may be absorbed by an electron of a silicon atom in the intrinsic silicon region 130 and may raise the electron into the conduction band in the intrinsic silicon region 130, creating free carriers 140 including an electron-hole pair (FIG. 1C). The free electron ($e^-$) travels toward the reverse biased N-doped region 125 and the free hole ($h^+$) travels toward the reverse biased P-doped region 120. When the free carriers 140 reach the P-doped region 120 and N-doped region 125 a unit of charge is registered in the external circuit of the FPA 100 and is accumulated in the capacitive element associated with the respective individual photodetector 105.

The individual photodetectors 105 are separated from each other by an isolation grid 135 (also referred to as a channel stop grid) which may include, for example, a grid of lightly doped N-type silicon, although in other embodiments, lightly doped P-type silicon may be used. The doping level of the material of the isolation grid 135 may be less than the doping level of either one or both of the P-doped regions 120 and N-doped regions 125 of the photodiodes 105. The isolation grid 135 may be shallow and extend downward into the bulk of the intrinsic silicon 130 to a shallower depth than the P-doped regions 120. The isolation grid 135 may be electrically floating, electrically unconnected to ground or any particular voltage source. Any "rogue" free carriers 145 that are generated in one photodetector 105 and that move toward another photodetector 105 are deflected by the isolation grid 135 so the free carrier 145 does not contribute to a reading in a photodetector 105 other than the one it was generated in.

The P-doped regions 120 and N-doped regions 125 of the photodetectors 105 are electrically conductive, while the intrinsic silicon region 130 is highly resistive. The P-doped regions 120 and N-doped regions 125 of the photodetectors 105 may capacitively couple to the conductive isolation grid 135. This capacitive coupling is represented by the capacitors C illustrated in FIG. 1A. The P-doped regions 120 and N-doped regions 125 of the photodetectors 105 act as first plates of these parasitic capacitors, the isolation grid 135 acts as second plates of the parasitic capacitors, and the intrinsic silicon regions 130 between the P-doped regions 120 and N-doped regions 125 and the isolation grid 135 acts as a dielectric for the parasitic capacitors.

In some implementations, a FPA 100 as illustrated in FIGS. 1A-1C may be operated in a rolling shutter mode of operation in which individual rows of photodetectors 105 are sequentially activated (brought out of reset) by applying a reverse bias current to the P-I-N photodiodes in subsequent rows of photodetectors 105. A row of photodetectors 105 may remain active for a short period of time over which photo-current generated in the photodetectors 105 in the row is accumulated to generate an indication of photonic flux impinging on the photodetectors 105 in the row and to generate a representation of a line in an image sensed by the FPA 100. A subsequent row of photodetectors 105, or multiple subsequent rows of detectors 105, may be activated while a previously activated row of photodetectors 105 is still in an activated state. Due to the capacitive coupling of the P-doped regions 120 and N-doped regions 125 of the photodetectors 105 to the isolation grid 135, the activation of a subsequent row of photodetectors 105 may a voltage potential to develop in the isolation grid 135 and cause crosstalk with previously activated rows of photodetectors 105. The isolation grid 135 may contribute to global crosstalk between each row of photodetectors 105.

Figure 2A:
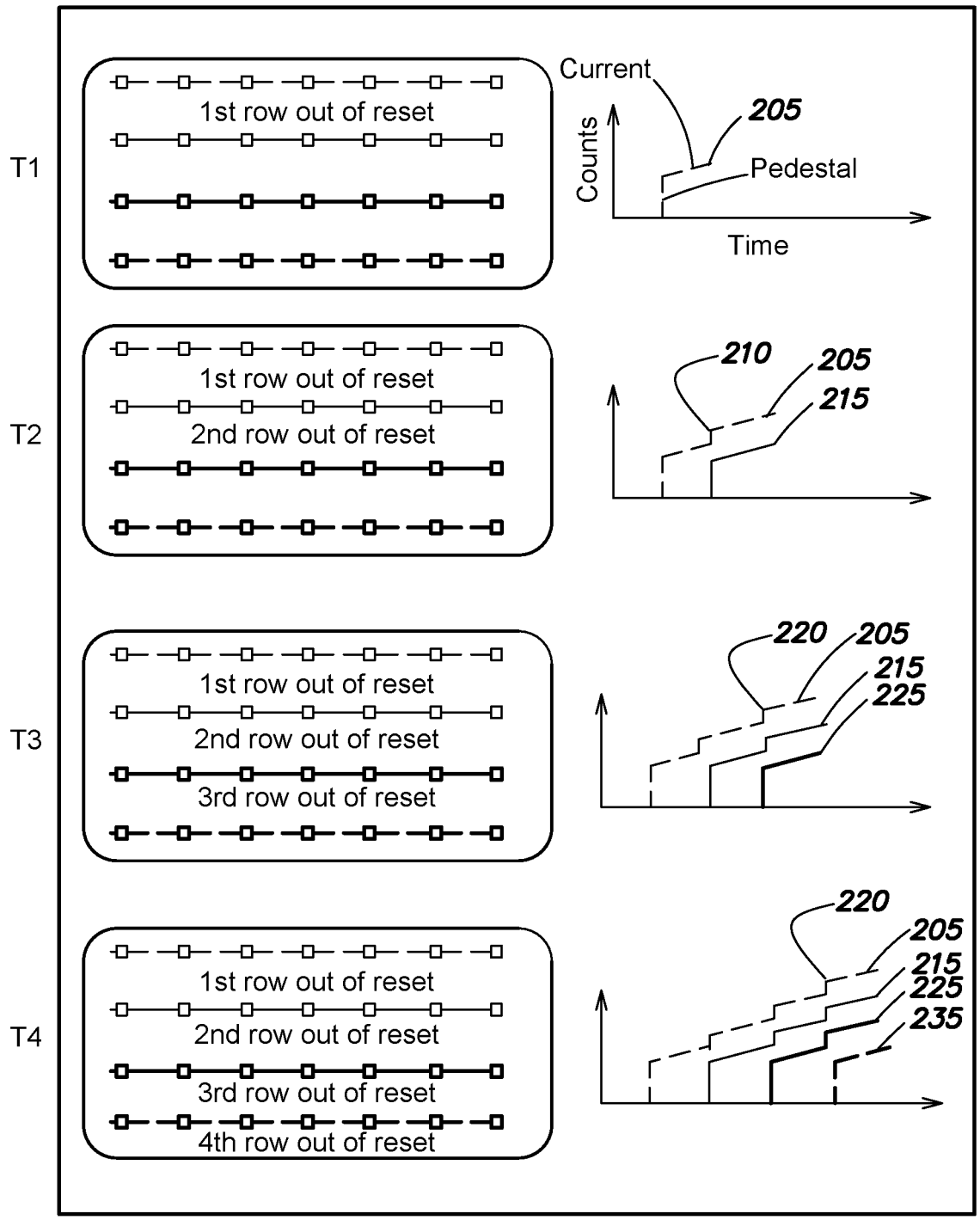
FIG. 2A illustrates a mechanism in which error may be introduced into the output of a conventional FPA operating in rolling shutter mode due to crosstalk between rows of photodetectors.
Figure 2B:
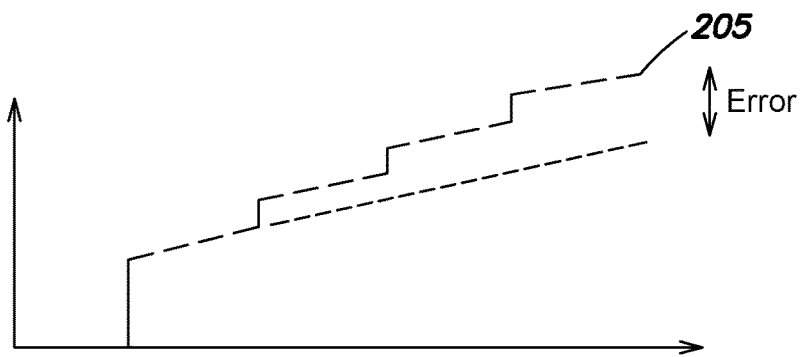
FIG. 2B further illustrates error that may be introduced into the output of a conventional FPA operating in rolling shutter mode due to crosstalk between rows of photodetectors.
Figure 2B:
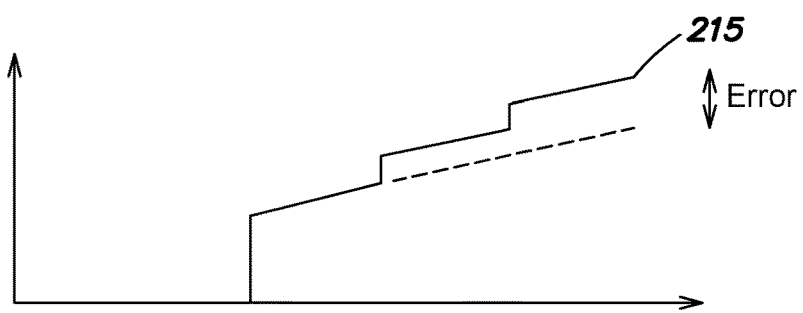
Figure 2B:
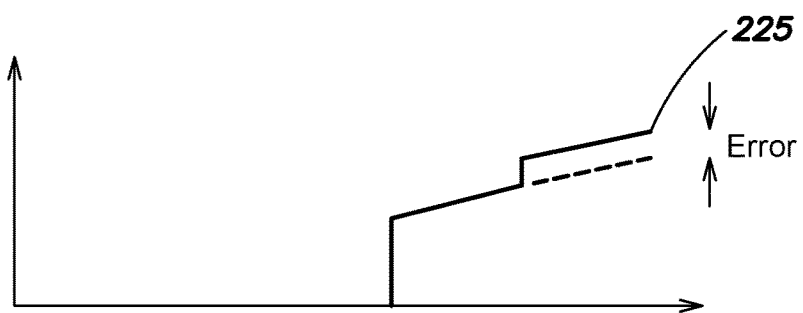
Figure 2B:

As illustrated in FIG. 2A, when a first row of photodetectors 105 is activated (brought out of reset) at time T1, for each photodetector 105 in the first row there is first an initial current surge, referred to as a pedestal, and then the capacitor begins integrating the charge/current, resulting in the counts versus time trace indicated at 205. When a second row of photodetectors 105 is activated at time T2, for each photodetector 105 in the second row there is first an initial current pedestal, and then the capacitor begin integrating the charge/current, resulting in the counts versus time trace indicated at 215. The voltage applied across the photodiodes in the second row induces a voltage in the isolation grid 135 due to the capacitive coupling between the second row of photodetectors 105 and the isolation grid 135. The voltage induced in the isolation grid 135 induces an additional voltage in the photodetectors 105 in the first row due to the capacitive coupling between the first row of photodetectors 105 and the isolation grid 135. The induced additional voltage in the photodetectors 105 in the first row results in an upward jog 210 in the counts versus time trace 205. The process continues at time T3 when the third row of photodetectors 105 is activated. When the third row of photodetectors 105 is activated at time T3, for each photodetector 105 in the third row there is first an initial current pedestal, and then the capacitor begin integrating the charge/current, resulting in the counts versus time trace indicated at 225. The voltage applied across the photodiodes in the third row induces a voltage in the isolation grid 135 due to the capacitive coupling between the third row of photodetectors 105 and the isolation grid 135. The voltage induced in the isolation grid 135 induces an additional upward jog 220 is created in the counts versus time trace 205 for photodetectors 105 in the first row of photodetectors 105 and a corresponding upward jog (unlabeled) is created in the counts versus time trace 215 for photodetectors 105 in the second row of detectors. At time T4, a fourth row of photodetectors is activated. When the fourth row of photodetectors 105 is activated at time T4, for each photodetector 105 in the fourth row there is first an initial current pedestal, and then the capacitor begin integrating the charge/current, resulting in the counts versus time trace indicated at 235. The voltage applied across the photodetectors in the fourth row (trace 235) causes an additional jog 230 to be created in the counts versus time trace 205 for photodetectors 105 in the first row of photodetectors 105, a corresponding upward jog (unlabeled) to be created in the counts v. time trace 215 for photodetectors 105 in the second row of photodetectors, and another corresponding upward jog (unlabeled) to be created in the counts versus time trace 225 for photodetectors 105 in the third row of photodetectors. FIG. 2B illustrates the degree of error in the counts versus time traces for the different rows of photodetectors at time T4. The error in the current integration reading for a previously activated row of photodetectors 105 increases with increasing time as additional rows of photodetectors 105 are activated until the current integration period for the previously activated row of photodetectors 105 is completed. For example, time trace 205, related to the first row of photodetectors 105, has the greatest risk of error due to jogs induced by the later activation of the other three rows of photodetectors 105 whereas time trace 235, related to the fourth row of photodetectors 105, has minimal risk of error. The error induced in the readings from each photodetectors 105 is image dependent and is difficult to remove by sensor calibration.

The effect of capacitive coupling of different rows of photodetectors 105 to one another through the isolation grid 135 causes the modulation transfer function of the FPA 100 to be degraded and reduces the quality of images and dynamic range obtainable with the FPA 100 as compared to an FPA 100 operating in the absence of crosstalk between detectors 105.

Figure 3A:
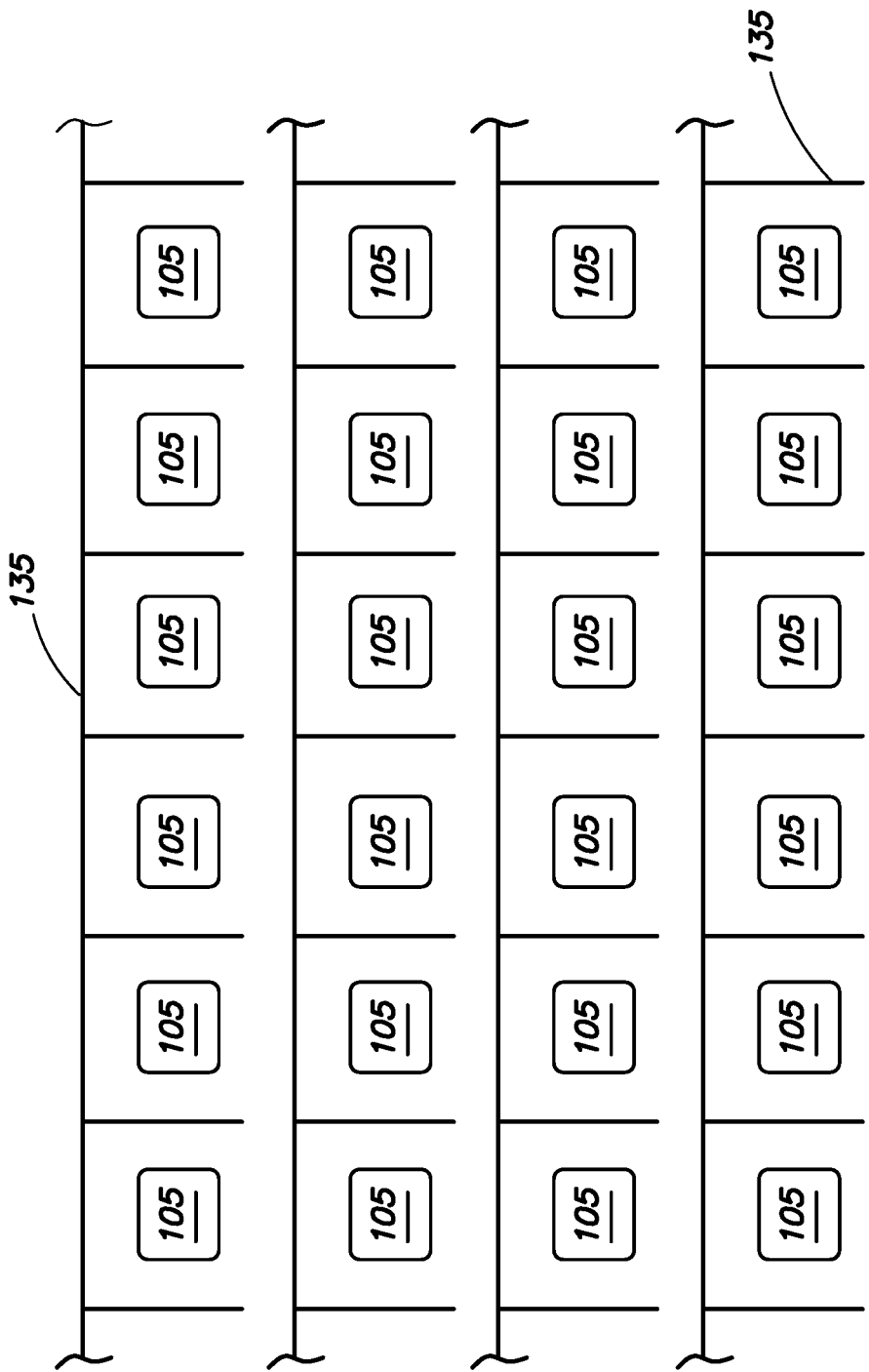
FIG. 3A is a plan view of an arrangement of a segmented channel stop grid that may mitigate crosstalk between rows of photodetectors in an FPA.
Figure 3B:
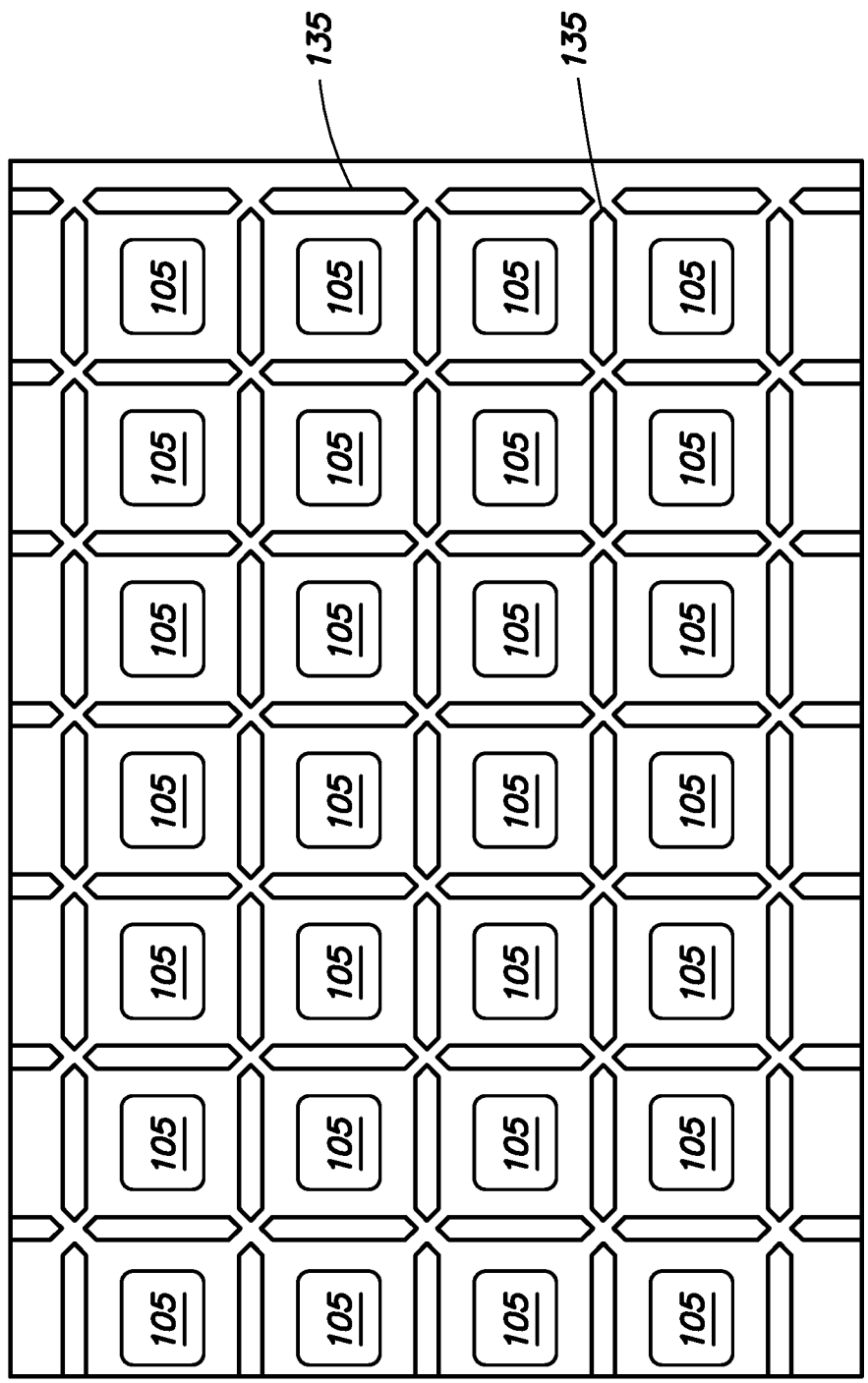
FIG. 3B is a plan view of an alternate arrangement of a segmented channel stop grid that may mitigate crosstalk between rows of photodetectors in an FPA.
Figure 2A:
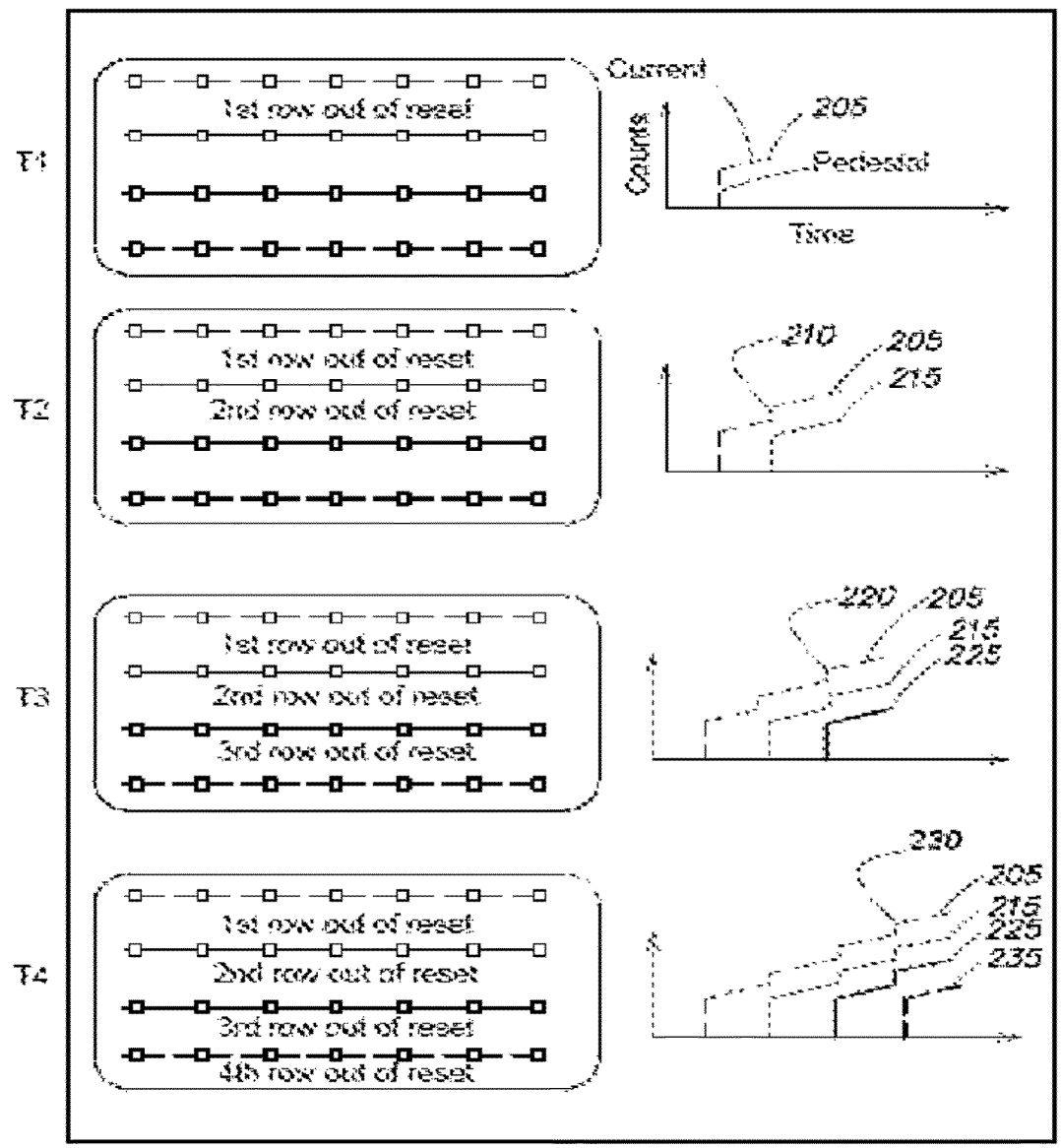

According to certain embodiments, segmenting the isolation grid 135 can be effective in mitigating the effect of global crosstalk between photodetectors 105 in the FPA 100. A segmented isolation grid 135 may include unconnected wall segments of doped material adjacent or at least partially surrounding different photodetectors 105 or portions thereof in different rows. In one embodiment, as illustrated in FIG. 3A, portions of the isolation grid 135 surrounding each individual row of photodetectors are separated from one another. Individual rows of the isolation grid 135 are contiguous, but adjacent rows are electrically separated. In another embodiment, illustrated in FIG. 3B, corners of each square grid cell of the isolation grid 135 surrounding each photodetectors 105 are left undoped, separating each square grid cell in to four electrically unconnected portions and forming a discontinuous grid. The segmentation of the isolation grid 135 prevents a change in potential in one segment from propagating to another segment. The global crosstalk between detectors 105 in different rows while operating in a rolling shutter mode is thereby mitigated. The transfer of potential from portions of the isolation grid 135 associated with one row of photodetectors 105 is prevented from propagating to portions of the isolation grid 135 associated with other rows of photodetectors 105.

Having described above several aspects of at least one embodiment, it is to be appreciated various alterations, modifications, and improvements will readily occur to those skilled in the art. For example, although illustrated as a grid of square elements, the isolation grid 135 may alternatively be formed from hexagonal elements that may be discontinuous at the vertices of the respective hexagrams. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An imaging system including a focal plane array comprising:

a first row of photodetectors including photodiodes;

a second row of photodetectors including photodiodes, the second row of photodetectors disposed adjacent to the first row of photodetectors; and a segmented isolation grid disposed between photodetectors in the first row of photodetectors and photodetectors in the second row of photodetectors, the segmented isolation grid including individual grid elements surrounding each individual photodiode in the first and second rows of photodetectors, a region of intrinsic semiconductor disposed between each individual photodiode and a corresponding segmented isolation grid element, each individual grid element including a plurality of electrically isolated regions that prevent flow of current between grid elements surrounding the photodiodes in the first and second rows of photodetectors.

2. The imaging system of claim 1, wherein the photodetectors in each of the first row of photodetectors and the second row of photodetectors comprise P-I-N diodes, each of the P-I-N diodes including a region of P-type semiconductor, a region of N-type semiconductor, and a region of intrinsic semiconductor disposed between the region of P-type semiconductor and the region of N-type semiconductor.

3. The imaging system of claim 2, wherein the photodetectors in each of the first row of photodetectors and the second row of photodetectors comprise silicon P-I-N diodes.

4. The imaging system of claim 1, wherein the segmented isolation grid includes doped wall segments formed surrounding P-type regions of the photodetectors in each of the first row of photodetectors and the second row of photodetectors.

5. The imaging system of claim 4, further comprising regions of intrinsic semiconductor disposed between the P-type regions and N-type regions of the photodetectors in each of the first row of photodetectors and the second row of photodetectors and the segmented isolation grid.

6. The imaging system of claim 4, wherein the segmented isolation grid includes a contiguous wall extending across one of the first row of photodetectors and the second row of photodetectors.

7. The imaging system of claim 4, wherein the segmented isolation grid includes discontinuous grid elements surrounding the photodetectors in each of the first row of photodetectors and the second row of photodetectors.

8. The imaging system of claim 5, wherein the segmented isolation grid has a doping concentration less than that of the P-type regions of the photodetectors and less than that of the N-type regions of the photodetectors.

9. The imaging system of claim 1, wherein the segmented isolation grid reduces a level of electrical crosstalk between photodetectors in the first row of photodetectors and photodetectors in the second row of photodetectors as compared to a substantially similar imaging system including a non-segmented isolation grid by deflecting free carriers generated in one photodetector from another photodetector.

10. The imaging system of claim 1, wherein the segmented isolation grid is electrically floating.

11. A method of operating a focal plane array, the method comprising:

applying a reverse bias to photodetectors in a first row of photodetectors of the focal plane array;

integrating photocurrent produced in the photodetectors in the first row of photodetectors; and applying a reverse bias to photodetectors in a second row of photodetectors of the focal plane array while continuing to integrate the photocurrent produced in the photodetectors in the first row of photodetectors, application of the reverse bias to the photodetectors in the second row of photodetectors inducing a voltage potential in portions of a segmented isolation grid associated with the second row of photodetectors, the voltage potential being prevented from propagating to portions of the segmented isolation grid associated with the first row of photodetectors by breaks in the segmented isolation grid between the portions of the segmented isolation grid associated with the first row of photodetectors and the portions of the segmented isolation grid associated with the second row of photodetectors.

12. The method of claim 11, comprising operating the focal plane array in a rolling shutter mode.

13. An imaging system including a focal plane array comprising:

an array of photodetectors including P-I-N photodiodes arranged in a plurality of rows and a plurality of columns; and an electrically floating segmented isolation grid comprising a wall of doped semiconductor having a doping level less than that of P-type regions of the P-I-N photodiodes and N-type regions of the P-I-N photodiodes, the segmented isolation grid including individual grid elements surrounding each individual P-I-N photodiode in the array of photodetectors, a region of intrinsic semiconductor disposed between each individual P-I-N photodiode and a corresponding segmented isolation grid element, each individual grid element including a plurality of electrically isolated regions that prevent flow of current between grid elements surrounding P-I-N photodiodes in adjacent rows.

* * * * *

UNITED STATES PATENT AND TRADEMARK OFFICE
CERTIFICATE OF CORRECTION

Page 1 of 2

PATENT NO.         : 10,672,826 B2
APPLICATION NO.    : 15/955820
DATED              : June 2, 2020
INVENTOR(S)        : Sean P. Kilcoyne et al.

It is certified that error appears in the above-identified patent and that said Letters Patent is hereby corrected as shown below:

Please replace Fig. 2A with Fig. 2A as shown on the attached drawing sheet

Signed and Sealed this
Twenty-second Day of June, 2021

Drew Hirshfeld
*Performing the Functions and Duties of the*
*Under Secretary of Commerce for Intellectual Property and*
*Director of the United States Patent and Trademark Office*